(12) United States Patent
Rha et al.

(10) Patent No.: US 8,524,098 B2
(45) Date of Patent: Sep. 3, 2013

(54) METHOD FOR FORMING NANO SIZE TURF ON TRANSPARENT POLYMER FILMS USED IN SOLAR CELLS, AND METHOD FOR ENHANCING TRANSMITTANCE OF TRANSPARENT POLYMER FILMS OF SOLAR CELLS

(75) Inventors: Jong Joo Rha, Kyungsangnam-do (KR); Koo Hyun Lee, Kyungsangnam-do (KR); Yong Soo Jeong, Kyungsangnam-do (KR); Wan Doo Kim, Daejeon (KR)

(73) Assignee: Korea Institute of Machinery and Materials, Daejeon (KR)

( * ) Notice: Subject to any disclaimer, the term of this patent is extended or adjusted under 35 U.S.C. 154(b) by 240 days.

(21) Appl. No.: 12/874,356

(22) Filed: Sep. 2, 2010

(65) Prior Publication Data

US 2011/0061734 A1 Mar. 17, 2011

(30) Foreign Application Priority Data

Sep. 11, 2009 (KR) ........................ 10-2009-0085734

(51) Int. Cl.
*B44C 1/22* (2006.01)
(52) U.S. Cl.
USPC ........................................................ 216/58
(58) Field of Classification Search
None
See application file for complete search history.

(56) References Cited

U.S. PATENT DOCUMENTS

| | | | | |
|---|---|---|---|---|
| 4,891,087 A | * | 1/1990 | Davis et al. | 156/345.47 |
| 2006/0160276 A1 | * | 7/2006 | Brown et al. | 438/149 |
| 2009/0079322 A1 | * | 3/2009 | Tsutsumi et al. | 313/349 |
| 2009/0159944 A1 | * | 6/2009 | Oh | 257/292 |

FOREIGN PATENT DOCUMENTS

| | | |
|---|---|---|
| KR | 10-2008-0029177 A | 10/2008 |
| KR | 10-2008-0100057 A | 11/2008 |
| KR | 10-0953388 A | 4/2010 |

OTHER PUBLICATIONS

Kang-Soo Han et al., Enhanced Transmittance of Glass Plates for Solar Cells Using Nano-Imprint Lithography, Solar Energy Materials & Solar Cells 94 (2010), 583-587.
Kang-Soo Han et al., Fabrication of Anti-Reflection Structure on Protective Layer of Solar Cells by Hot Embossing Method, Solar Energy Materials & Solar Cells 93 (2009), 1214-1217.
Byeong-Ju Bae et al., Fabrication of Moth-Eye Structure on Glass, Japanese Journal of Applied Physics 48 (2009) 010207.

* cited by examiner

*Primary Examiner* — Shamim Ahmed
*Assistant Examiner* — Bradford Gates
(74) *Attorney, Agent, or Firm* — Maier & Maier PLLC

(57) ABSTRACT

The method for forming nano size turfs on a surface of a transparent polymer film used in a solar cell is disclosed, which comprises a first step for attaching a transparent polymer film on a glass, a second step for installing the glass prepared in the first step on an upper side of the electrodes provided in the interior of a chamber and forming either a vacuum environment or an atmospheric environment, and a third step for supplying an electric power to the electrodes under the environment formed in the second step, etching the transparent polymer film attached on the surface of the glass and forming nano size turfs in circular cone shapes.

7 Claims, 8 Drawing Sheets

*Available from the International Steel Wool Corp.

(a)

(b)

METHOD FOR FORMING NANO SIZE TURF ON TRANSPARENT POLYMER FILMS USED IN SOLAR CELLS, AND METHOD FOR ENHANCING TRANSMITTANCE OF TRANSPARENT POLYMER FILMS OF SOLAR CELLS

CROSS-REFERENCES TO RELATED APPLICATION

This patent application claims the benefit of priority from Korean Patent Application No. 10-2009-0085734, filed on Sep. 11, 2009, the contents of which are incorporated herein by reference.

TECHNICAL FIELD

The present invention relates to a method for forming nano size turf on a transparent polymer film used in solar cells, and a method for enhancing the transmittance of a transparent polymer film of a solar cell.

BACKGROUND ART

A solar cell is referred to a device for converting a light energy into an electric energy. In the solar cell, it is important to absorb as much as solar energy in order to enhance the efficiency of the solar cell. In the event of a solar cell made of Si, GaAs, $Cu_2S$ which have a large reflection index and a solar cell formed in a M-S layer MIS structure in which an insulation film is formed on the surface of a semiconductor and a metallic layer is attached on the film, about 20~30% of incoming light fail to generate electric charges, namely they are reflected. As a method for reducing the reflection of light, about 10% of light reflection loss can be prevented by texturing the surface in stripe patterns. In another method for reducing the reflection of light, there is an antireflection coating method in which a transparent thin film layer having an index of refraction between a semiconductor and air is made with a certain proper thickness. The silicon has 34% of light reflection loss in a longer wavelength (1.1 µm) and has 54% of light reflection loss in a shorter wavelength (0.4 µm). In the event that a transparent polymer film is made in a single layer, it is possible to reduce the reflection index by 10% in average in the above wavelength ranges.

In the method for forming a transparent polymer film, as shown in FIG. 1A, a substance having an index of refraction between a medium (air) and a substance (a glass) is coated on the surface of a glass. The lights reflected from the surface of the coating substance and the interface between the coating substance and the glass are interfered with each other and are offset when adjusting the thickness of the coating substance coated on the surface to $\lambda/4$ with respect to a specific wavelength, as a result of which the effects of the transparent polymer film can be enhanced as shown in FIG. 1B. So, it is needed to coat the substances in multiple layers for maximizing the anti reflection effects.

In the event of solar cells, a variety of researches are performed in order to enhance the efficiency. It is needed to coat a transparent polymer film on a cover a glass so that a lot of solar light can come into the interior of the solar cell. In the conventional art, a method for coating the surface of a glass is generally used. However, in the above conventional method, as the incident angle of the solar light continues to increase, the reflection of the solar light continues to increase as well, so the transmittance of the solar light is disadvantageously lowered. In recent years, a method for enhancing the effects of antireflection by forming nano size turfs in a moth eye structure comes up with a big attention.

While researching the transparent polymer film used in a solar cell, the inventors of the present invention have developed and completed a method for enhancing the transmittance of a transparent polymer film in such a manner that the nano size turfs are formed in a circular cone shape by using plasma by attaching a transparent polymer film on a glass over its large surface area.

DISCLOSURE OF THE INVENTION

Accordingly, it is an object of the present invention to provide a method for forming nano size turf on a transparent polymer film which is used in solar cells.

It is another object of the present invention to provide a method for enhancing the transmittance of a transparent polymer film which is used in a solar cell.

To achieve the above objects, there is provided a method for forming nano size turfs on a surface of a transparent polymer film used in a solar cell which comprises a first step for attaching a transparent polymer film on a glass; a second step for installing the glass prepared in the first step on an upper side of the electrodes provided in the interior of a chamber and forming either a vacuum environment or an atmospheric environment; and a third step for supplying an electric power to the electrodes under the environment formed in the second step, etching the transparent polymer film attached on the surface of the glass and forming nano size turfs in circular cone shapes.

In the present invention, there is provided a method for enhancing a transmittance of a transparent polymer film used in a solar cell which is characterized in that light can be prevented from reflection by changing the refraction index of incoming light by forming circular cone-shaped nano size turfs on the surface of a transparent polymer film used in a solar cell.

EFFECTS

In the method for forming nano size turfs on the surface of a transparent polymer film used in a solar cell, a reliable stability can be obtained during the formation of nano size turfs by attaching a transparent polymer film on a glass, and since the plasma is used, a preparation process can be simple. The refraction index of light can be changed as nano size turfs are provided in a solar cell in circular cone shapes, by which it is possible to prevent the light from reflection for thereby enhancing a light efficiency of solar cells.

BRIEF DESCRIPTION OF THE DRAWINGS

The present invention will become better understood with reference to the accompanying drawings which are given only by way of illustration and thus are not limitative of the present invention, wherein.

MODES FOR CARRYING OUT THE INVENTION

The method for forming nano size turfs on the surface of a transparent polymer film used in a solar cell according to the present invention comprises a first step for attaching a transparent polymer film on a glass; a second step for installing the glass prepared in the first step on the electrodes provided in the interior of a chamber which is either a vacuum environment or an atmospheric environment; and a third step for supplying an electric power to the electrodes under the environment formed in the second step, etching the transparent polymer film attached on the surface of the glass to form nano size turfs in circular cone shapes.

The method for forming nano size turfs on the surface of an anti reflection film used in a solar cell according to the present invention will be described in detail.

In the first step of the present invention, a transparent polymer film is attached on a glass.

Since it is difficult to form nano size turfs on the surface of a glass directly, the step for attaching a transparent polymer film on the surface of a glass is firstly performed, by which nano size turfs can be easily formed on the large surface area of a polymer by only plasma etching without nano-patterned masks or molds.

Figure 1:
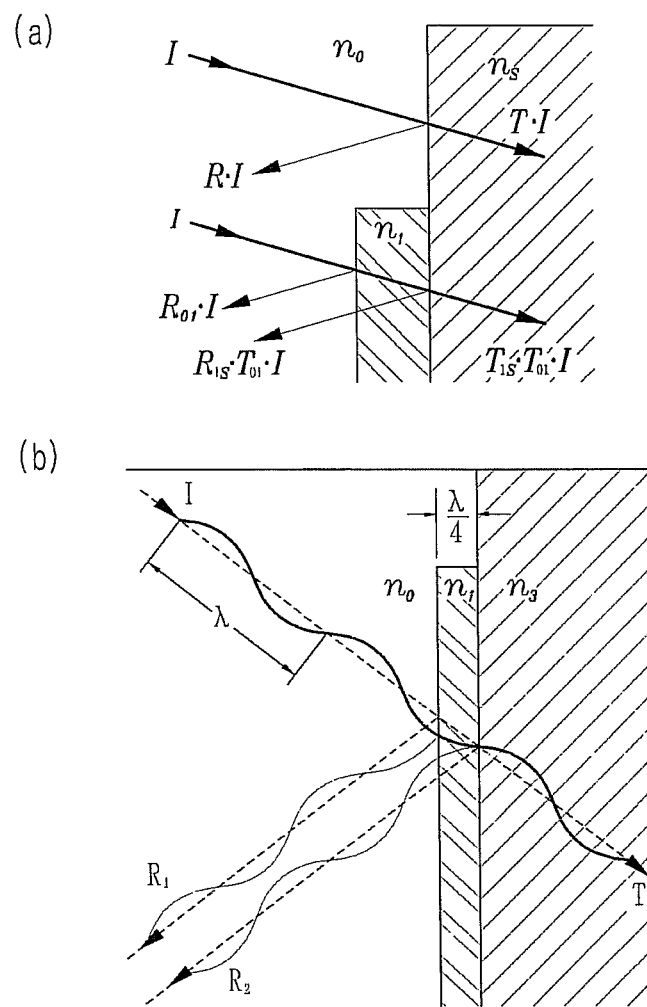
FIG. 1 is a view illustrating a light path (a) when there is an optical coating or not and a light path (b) when the thickness of a coating layer is a $\lambda/4$ wavelength.
Figure 2:
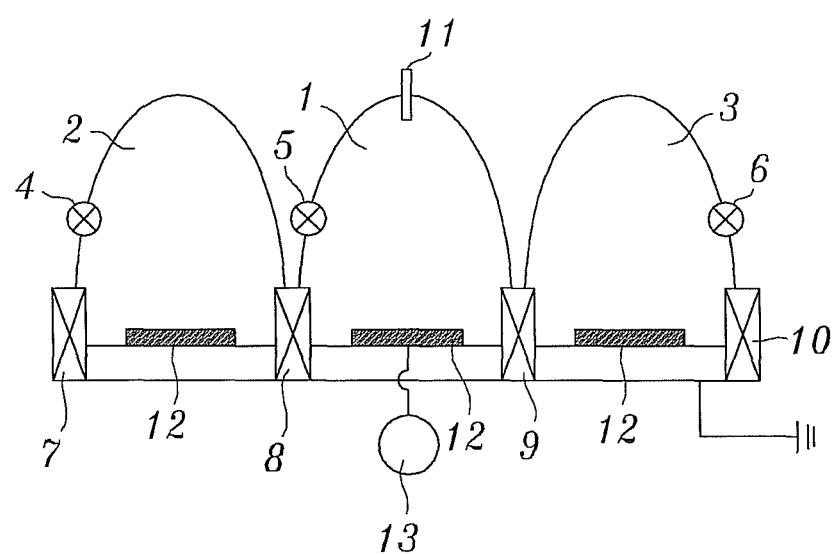
FIG. 2 is a schematic view illustrating a vacuum chamber used when forming nano size turfs on the surface of a transparent polymer film used in a solar cell according to the present invention.

When attaching a transparent polymer film on the glass, a silane coupling agent is first coated on the surface of a glass, and a transparent polymer film is made flat and attached on the surface of a glass according to the technical manual provided from DuPont corporation, as shown in FIG. 2, and is maintained for 10 minutes under 10 psi at 296° C. and then is cooled. The above method is not limited thereto.

The transparent polymer film preferably consists of a fluorine transparent polymer film such as Fluorinated Ethylene Propylene (FEP), PerFluoroAlkoxy (PFA), PolyVinyl Fluoride (PVF) and PolyVinylidene Fluoride (PVDF), an acryl transparent polymer film with a high transmittance like Polymethyl Methacrylate, and a transparent polymer film of Polyethylene Terephthalate (PET) and Polycarbonate (PC).

In the second step according to the present invention, the glass prepared in the first step is installed on an electrode provided in a chamber, which is a vacuum environment or an atmospheric environment.

The nano size turfs can be formed on the surface of a transparent polymer film used in the solar cell by either generating plasma on the surface of the glass in the chamber under a vacuum environment or generating plasma on the surface of a glass under an atmospheric environment. A vacuum chamber is needed so as to make the surroundings of the surface of the glass a vacuum environment. Electrodes are installed in the vacuum chamber, electrically insulated from the vacuum chamber, and arranged to be selectively supplied with electric power. The electrodes are supplied with a negative (−) bias DC voltage from a DC power supply outside the vacuum chamber or with a self bias voltage through a RF power supply for thereby generating plasma. The surface of the glass, which is to be etched, is placed on the electrodes.

When forming nano size turfs on the surface of the polymer attached to the glass, electric power is supplied to the electrodes so as to generate plasma and accelerate ions. At this time, when a counter electrode is absent, plasma is generated under the vacuum environment, and when a counter electrode is present, plasma is generated under atmospheric environment. If the thickness of the glass to be used is thick, it is preferred to generate plasma under the vacuum environment. Since a relatively higher electric field is needed so as to generate plasma under at the atmospheric environment, the distance between two electrodes is very important. Plasma can be stably generated in a gap of a couple of mm. So when the thickness of a glass disposed between two electrodes is thick, it is hard to generate plasma.

In the third step according to the present invention, the transparent polymer film attached on the surface of the glass is etched for thereby forming nano size turfs in circular cone shapes by plasma under the environment of the second step.

When the plasma is used so as to form nano size turfs in circular cone shapes on the surface of transparent polymer, it is needed to control only the plasma process without using a nano patterned.

Figure 3:
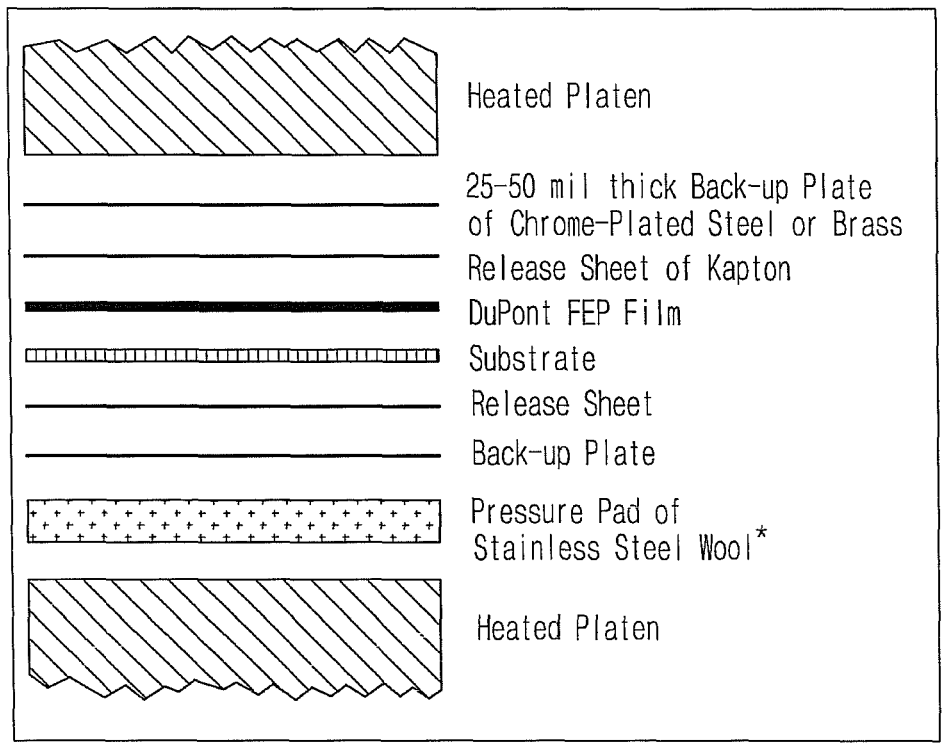
FIG. 3 is a view illustrating a construction of dedicated equipment disclosed in the manual provided from DuPont Corporation, which is used for attaching a transparent polymer film on a glass.

The plasma process for forming the nano size turfs on the surface of the transparent polymer attached on the glass can be performed by using the vacuum chamber system of FIG. 3. In this event, assistant chambers are installed in a front end and a rear end of a main chamber 1, respectively. A fore chamber 2 is formed and stays with a test sample being disposed on the electrodes. A post chamber 3 is formed to maintain a certain vacuum level in the main chamber 1 before the electrodes with nano size turfs are introduced into the atmospheric environment. With the above constructions, it is possible to continuously conduct the processes, which results in enhancing the productivity. The main chamber 1 keeps a certain vacuum level enough to form nano size turfs on the surface of the transparent polymer. The fore chamber 2 keeps an atmospheric environment when the electrodes and the test sample are inputted. The valve 7 to the side of the atmospheric environment for inputting the test sample is closed after the test sample is inputted, and the valve connected with the vacuum pump is opened for thereby forming a vacuum state to match with the vacuum level of the main chamber 1. The valve 8 connected with the main chamber 1 is opened, and the electrodes and the test samples are transferred and mounted in place. The valve 8 of the main chamber keeps closed in the course of the treatment in the main chamber 1. New electrodes and test sample 12 are inputted through the valve 7 to the side of the atmospheric environment. Meanwhile the test sample treated in the main chamber 1 is transferred to the post chamber 3 along with the electrodes. At this time, the port chamber 3 keeps the same vacuum level as the main chamber 1. After the test sample has been transferred, the valve 9 between the main chamber 1 and the post chamber 3 is closed. The post chamber 3 has the atmospheric pressure, and the valve 10 to the side of the atmospheric environment opens, and the test sample is transferred into the air. After the test sample has been transferred, processes can be continuously performed, and more electrodes which sizes were enlarged can be provided for thereby enhancing productivity.

The etching is performed in a voltage range of 550~670V, and the pressure is in a range of 90~200 mTorr. It is preferred that the etching is performed for 4~8 minutes. When the voltage is less than 550V, a certain surface roughness enough for the effects of antireflection is not formed, and when the voltage exceeds 670V, excess energy consumption happens. When the pressure is less than 90 mTorr, a certain surface roughness enough for the effects of antireflection is not formed, and when the pressure exceeds 200 mTorr, the formation for the surface roughness is not performed properly. When the time is less than 4 minutes, a desired surface roughness is not obtained, and when the time exceeds 8 minutes, the formation for the surface roughness is not performed properly. The diameter of each nano size turf formed on the surface of polymer might be in a range of 200~300 nm, and the height of the same is preferably in a range of 100~300 nm.

The etching can be activated as a reaction gas is selectively added. The reaction gas can be oxygen, nitrogen, moisture, argon, helium, fluorocarbon, carbochlorine and a mixture of at least two components.

The present invention is directed to providing a transparent polymer film used in a solar cell with nano size turfs formed in circular cone shapes, with its upper side being formed to be sharp, with its lower side being formed to be wide.

According to the analysis 4, the diameter of each nano turf is in a range of 200~300 nm, and the length of the same is in a range of 100~300 nm.

The present invention is directed to providing a method for enhancing a transmittance of a transparent polymer film used in a solar cell so as to prevent light from reflection by forming nano size turfs on the surface of a transparent polymer film used in a solar cell in circular cone shapes for changing the refraction index of light.

The nano size turfs according to the present invention are formed by a first step for attaching a transparent polymer film on a glass; a second step for installing the glass prepared in the first step on an upper side of the electrodes provided in the interior of a chamber and forming either a vacuum environment or an atmospheric environment; and a third step for supplying an electric power to the electrodes under the environment formed in the second step, etching the transparent polymer film attached on the surface of the glass and forming nano size turfs in circular cone shapes.

In addition, the nano size turfs can be formed so that the light reflected from the interfaces of the glass can be interfered with each other and can be offset by gradually changing the reflections. The above effects can be obtained with respect to the light of broadband wavelengths as well as the light being incident at slanted angles. So, it is possible to enhance the transmittance of a transparent polymer film.

The transparent polymer film can transmit the light, of which wavelength is above 350 nm, by more than 95%. Referred to the experiment example 1, it is known that the light transmittance of a transparent polymer with nano size turfs is above 95% in higher than 350 nm wavelength.

The preferred embodiments of the present invention will be described below. The following embodiments are provided for only illustrative purposes, while not being limited to the following embodiments of the present invention.

FIRST EMBODIMENT

Formation of Nano Turfs on the Surface of a Transparent Polymer Film Used in a Solar Cell First step: Step for attaching a transparent polymer film on a glass.

A silane coupling agent (Dowcorning corporation, Z-6106 Silane or Xiameter, OFS-6106) is uniformly coated on the glass of 25 mm×25 mm so as to attach Fluorinated Ethylene Propylene (FEP) film on a glass substrate, and a FEP film is arranged and attached from one end to the other end while supplying a uniform pressure by blade. By the above method, it is possible to eliminate the air between the glass and the film. The size of the FEP film is larger than the size of the glass substrate. The test sample is mounted on a hot plate, and a polyimide film (corresponding to Capton film) is covered, which works like a release film, and the temperature is maintained at 300° C. for 10 minutes while being supplied with a weight of 5 kg, and after which the test sample is cooled, and then a transparent polymer film is attached on the glass.

Second step: Step for installing the glass on the upper side of the electrodes provided in the chamber and for making either vacuum environment or atmospheric environment.

The glass prepared in the first step is installed on the upper side of the electrodes which is electrically insulated from the vacuum chamber and to which electric power can be selectively supplied. The electrodes are arranged to receive negative biases from the power supply outside the vacuum chamber and to generate plasma. The glass with a transparent polymer of which surface is to be etched is placed on the electrodes. The electrodes are larger than the sizes of the object which is to be processed. Here, counter electrodes can be closely provided so as to generate uniform plasma. The rotary pump is used so as to make the chamber vacuum, and the air of the chamber is evacuated until the pressure of the chamber became less than $5 \times 10^{-3}$ Torr.

Third step: Step for forming nano turfs in circular cone shapes by etching the polymer film by supplying electric power to the electrodes for generating plasma.

Oxygen gas is supplied into the main chamber by using Mass Flow Controller (MFC) while maintaining the vacuum level at less than $5 \times 10^{-3}$ Torr in the main chamber. At this time, the range of the maintained pressure is from 10 mTorr to the atmospheric pressure. In particular, the thickness of a glass is less than a couple of mm under the atmospheric pressure, and it is preferably less than 3 mm. Even when the thickness of the glass is thick, it is possible to generate plasma by increasing the voltage. At this time, it is preferred that the power capable of generating relatively shorter pulses is used.

Analysis 1: Surface Roughness and Transmittance Change Analysis of Polymer Formed on the Surface of a Transparent Polymer Film Based on the Time Needed for the Supply of Voltage.

Figure 4:
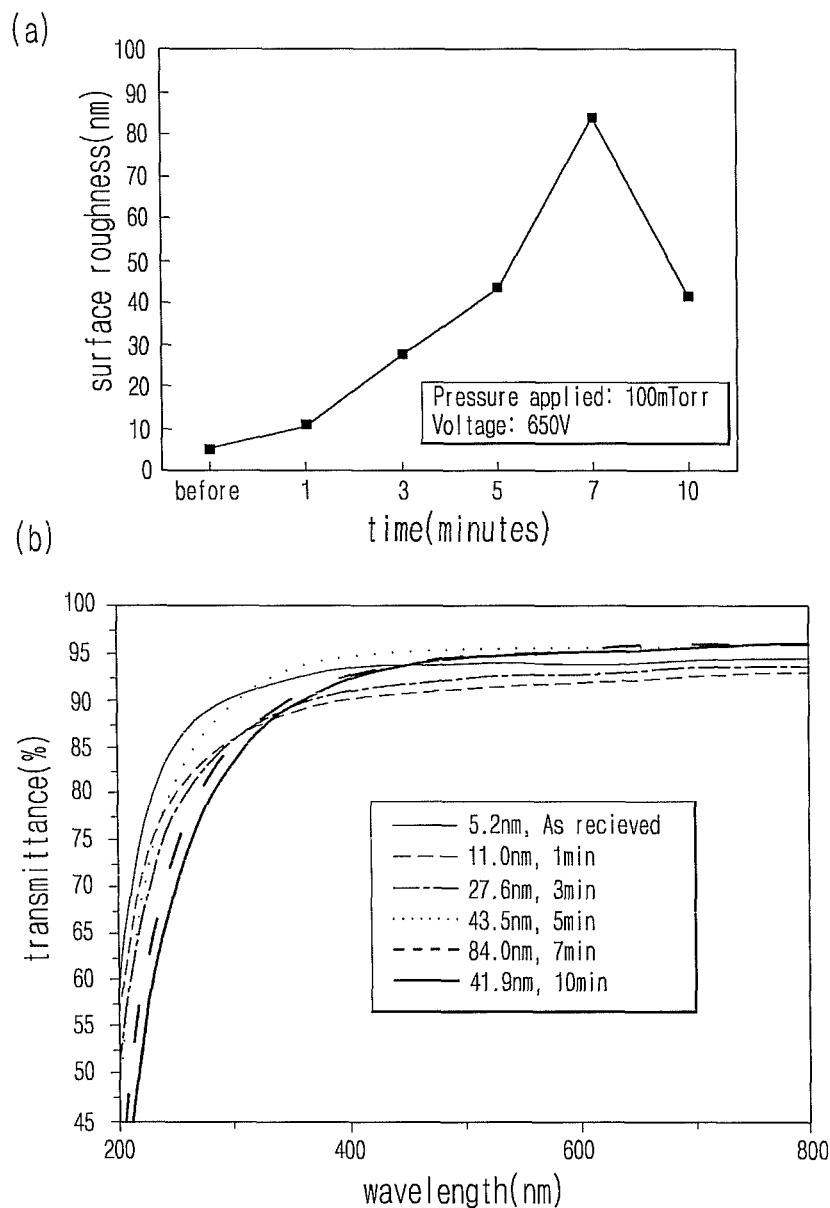
FIG. 4 is a graph illustrating the changes of surface roughness and a transmittances on the surface of a transparent polymer film based on the etching time, in which (a) is a surface roughness, and (b) is transmittances.

The surface roughness and transmittance change analysis of polymer formed on the surface of a transparent polymer film based on the time needed for the supply of voltage are analyzed, a result of which is shown in FIG. 4.

The surface roughness and transmittance of the polymer formed on the surface of the transparent polymer film based on the time applied at AC 40 kHz rms (root-mean square) voltage 650V are analyzed by the power supply apparatus (Advanced Energy corporation PE II Model) under the pressure of 100 mTorr.

As shown in FIG. 4A, as the time needed for applying the voltage increases, the surface roughness increases, but the roughness decreases after 7 minute. Also, as shown in FIG. 4B, as the voltage needed for applying the voltage increases, the transmittance increases.

Analysis 2: Surface Roughness and Transmittance Analysis of Polymer Formed on the Surface of the Transparent Polymer Film Based on the Voltage Applied.

Figure 5:
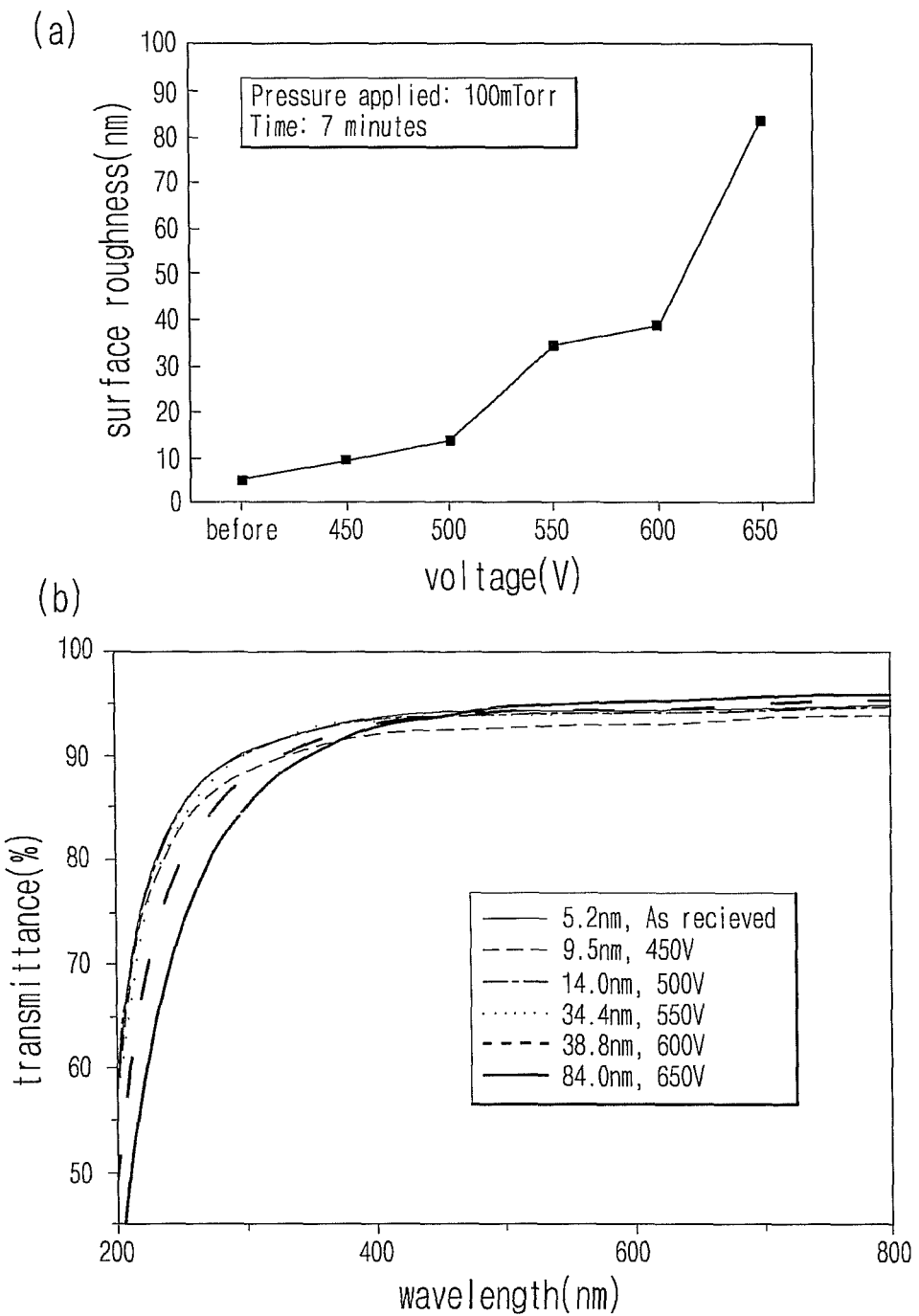
FIG. 5 is a graph illustrating the changes of surface roughness and a transmittances on the surface of a transparent polymer film based on the applied voltage, in which (a) is surface roughness, and (b) is transmittances.

The surface roughness and transmittance analysis of polymer formed on the surface of the transparent polymer film based on the voltage applied are analyzed, a result of which is shown in FIG. 5.

The FEP film is attached to the glass, and the electrodes are installed in the chamber, and the time needed for applying the voltage is set 7 minutes while keeping the pressure at 100 mTorr, and the surface roughness and transmittance change of the polymer are analyzed based on the voltage applied.

As shown in FIG. 5A, as the voltage applied increases, the surface roughness of the polymer increases, and as shown in FIG. 5B, as the voltage applied increases, the transmittance increases.

Analysis 3: Surface Roughness and Transmittance Analysis of Polymer Formed on the Surface of the Transparent Polymer Film Based on the Amount of Oxygen Gas Supplied.

Figure 6:
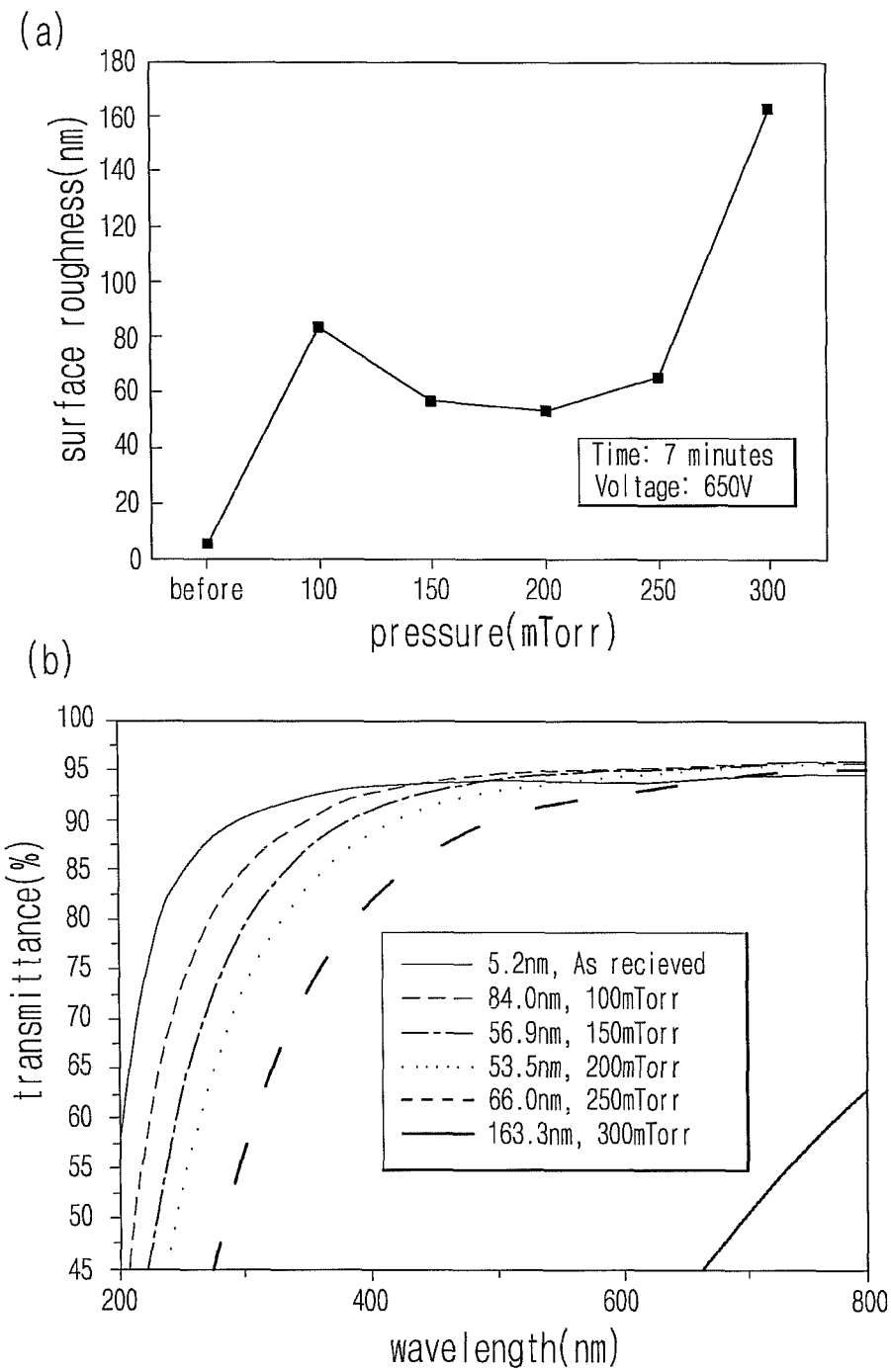
FIG. 6 is a graph illustrating the changes of surface roughness and a transmittances on the surface of a transparent polymer film based on the pressures, in which (a) is surface roughness, and (b) is a transmittances.

The surface roughness and transmittance analysis of polymer formed on the surface of the transparent polymer film based on the amount of oxygen gas supplied are analyzed, a result of which is shown in FIG. 6.

The surface roughness and transmittance change of the polymer formed on the surface of the transparent polymer film are analyzed while changing the pressure of the chamber from 100 mTorr to 300 mTorr at the interval of every 50 mTorr in a state that the voltage applied is set 650V, and the voltage applying time is set 7 minutes.

As shown in FIG. 6A, the surface roughness of the polymer increases until the pressure of the chamber becomes 100 mTorr, but the surface roughness decreases until 200 mTorr. However, the surface roughness increases again after 250 mTorr. In addition, as shown in FIG. 6B, when the pressure of the chamber is above 100 mTorr, the transmittance increased, but when the pressure is above 200 mTorr, the transmittance increases when the wavelength of light is above 250 nm. In the event of 300 mTorr, the transmittance increases when the wavelength of light is above about 650 nm, but the transmittance is not enhanced.

Analysis 4: Analysis of Nano Size Turfs Formed on the Surface of a Transparent Polymer Film.

Figure 7:
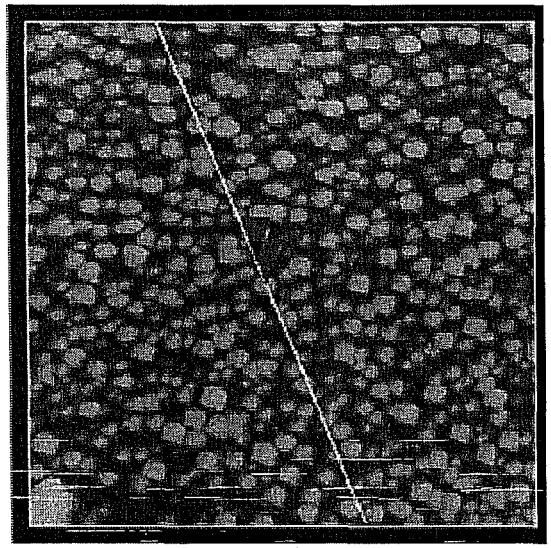
FIG. 7 is an AFM topography (a) of nano size turf and a graph (b) of a cross sectional profile of the surface construction measurement according to the present invention.
Figure 7:
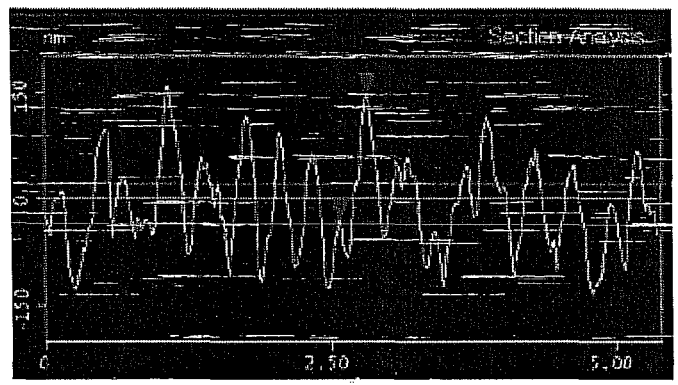

The nano size turfs formed on the surface of the antireflection used in a solar cell are analyzed by AFM, Digital Instrument, Nanoscope IIIa, a result of which is shown in FIG. 7.

As shown in FIG. 7, since the nano size turfs according to the present invention are formed in circular cone structures with their upper sides being sharp, with their lower sides being wide, which maximize the effects of transparent polymer films while achieving a stable structure. The diameter of each turf is in a range of 200~300 nm, and the height is in a range of 100~300 nm.

As a result of the evaluation with respect to the effects of the transparent polymer film by using the transmittance based on the surface roughness of the polymer, the effects of transparent polymer films are obtained in a range of 30~110 mm.

COMPARISON EXAMPLE 1

Preparation of Solar Cell Transparent Polymer Film without Having Nano Size Turfs The solar cell transparent polymer film without having nano size turfs is prepared by performing the first step according to the present invention.

EXPERIMENT EXAMPLE 1

Figure 8:
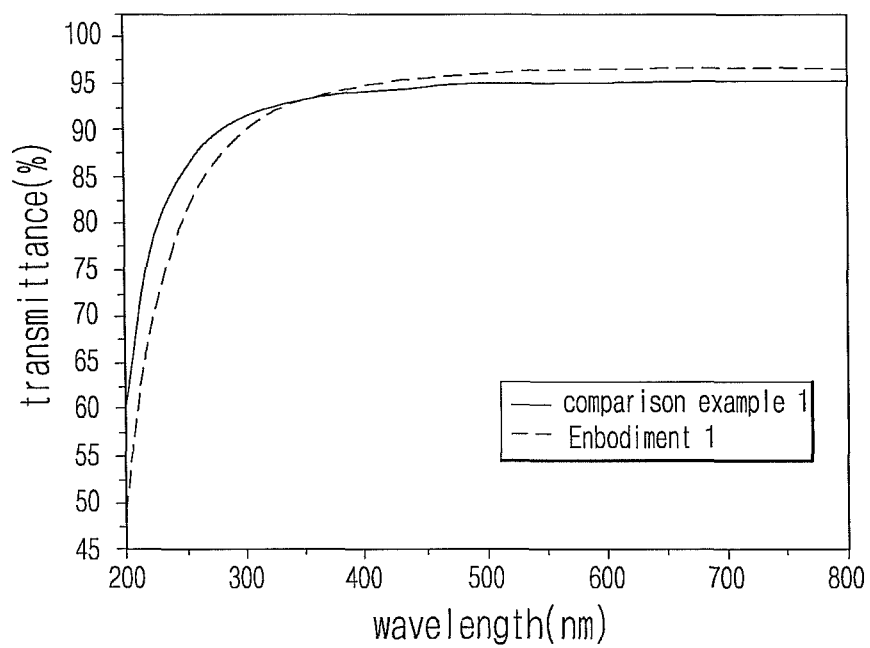
FIG. 8 is a graph of the light transmittances of the first embodiment and the comparison example 1 according to the present invention.

Light Transmittance Measurement by Forming Nano Size Turfs on the Surface of Transparent Polymer Film Used in a Solar Cell The light transmittances between the embodiment 1 which forms nano size turfs on the surface of a transparent polymer film used in a solar cell and the comparison example 1 which does not form nano turfs are measured by UV-Vis-NIR-Spectrophotometer, VARIAN company, a result of which is shown in FIG. 8.

As shown in FIG. 8, it is known that the transmittance of the transparent polymer film with the nano size turfs of the first embodiment in the light having more than 350 nm of wavelength is more enhanced as compared to the light transmittance of the transparent polymer film which does not have nano size turfs of the comparison example 1.

As the present invention may be embodied in several forms without departing from the spirit or essential characteristics thereof, it should also be understood that the above-described examples are not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. A method for forming nano size turfs on a surface of a transparent polymer film used in a solar cell as an antireflection transparent polymer film, consisting of:
    a first step for attaching a transparent polymer film on a glass;
    a second step for installing the glass prepared in the first step on an upper side of electrodes provided in a chamber which forms either a vacuum environment or an atmospheric environment; and
    a third step for supplying an electric power to the electrodes under the environment formed in the second step, etching the transparent polymer film attached on the surface of the glass without any mask to form nano size turfs in circular cone shapes on the surface of the transparent polymer film, wherein said transparent polymer film of the first step is selected from the group consisting of Fluorinated Ethylene Propylene (FEP), PerFluoroAlkoxy(PFA), PolyVinyl Fluoride (PVF), PolyVinylidene Fluoride (PVDF), Polymethyl Methacrylate, Polyethylene Terephthalate (PET) and Polycarbonate (PC).

2. The method of claim 1, wherein said chamber of the second step comprises assistant chambers, which are a fore chamber which is formed and stays with a test sample being disposed on the electrodes, and a post chamber which is formed to maintain a certain vacuum level in the main chamber before the nano size turfs are introduced into the atmospheric environment, at a front end and a rear end of a main chamber, respectively, thereby enhancing the productivity of nano size turfs.

3. The method of claim 1, wherein said etching of the third step is activated as a reaction gas is selectively supplied.

4. The method of claim 3, wherein said reaction gas is selected from the group consisting of oxygen, nitrogen, moisture, argon, helium, fluorocarbon, carbochlorine and a mixture of at least two components.

5. A method for enhancing a transmittance of an antireflection transparent polymer film used in a solar cell characterized in changing the refraction index of incoming light by forming circular cone-shaped nano size turfs on the surface of a transparent polymer film used in a solar cell by means of the method consisting of:
    a first step for attaching a transparent polymer film on a glass;
    a second step for installing the glass prepared in the first step on an upper side of electrodes provided in a chamber which forms either a vacuum environment or an atmospheric environment; and a third step for supplying an electric power to the electrodes under the environment formed in the second step, etching the transparent polymer film attached on the surface of the glass without any mask to form nano size turfs in circular cone shapes on the surface of the transparent polymer film, wherein said transparent polymer film of the first step is selected from the group consisting of Fluorinated Ethylene Propylene (FEP), PerFluoroAlkoxy (PFA), PolyVinyl Fluoride (PVF), PolyVinylidene Fluoride (PVDF), Polymethyl Methacrylate, Polyethylene Terephthalate (PET) and Polycarbonate (PC).

6. The method of claim 5, wherein said antireflection transparent polymer film can transmit more than 95% of the light with a wavelength higher than 350 nm.

7. The method of claim 5, wherein each circular cone-shaped nano size turf formed on the surface of a transparent polymer film has a diameter of 200~300 nm, and a length of 100~300 nm.

* * * * *